United States Patent
Kim et al.

(10) Patent No.: US 8,315,051 B2
(45) Date of Patent: Nov. 20, 2012

(54) PORTABLE ELECTRONIC DEVICE HAVING INTERCEPTOR FOR FOREIGN SUBSTANCE

(75) Inventors: Jae-Shik Kim, Gyeonggi-do (KR); Tae-Hwa Jung, Seoul (KR); Seung-Hyub Baek, Gyeonggi-do (KR); Jong-Cheon Wee, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 359 days.

(21) Appl. No.: 12/699,159

(22) Filed: Feb. 3, 2010

(65) Prior Publication Data
US 2010/0195275 A1 Aug. 5, 2010

(30) Foreign Application Priority Data
Feb. 4, 2009 (KR) .................. 10-2009-0008747

(51) Int. Cl.
*G06F 1/16* (2006.01)
(52) U.S. Cl. ............ 361/679.56; 361/679.3; 455/575.1; 312/223.1; 312/223.2
(58) Field of Classification Search ............... 361/679.3; 455/575.1
See application file for complete search history.

(56) References Cited

U.S. PATENT DOCUMENTS

| 6,532,152 | B1 * | 3/2003 | White et al. | 361/692 |
| 7,551,949 | B2 * | 6/2009 | Schworm | 455/575.1 |
| 2006/0166711 | A1 * | 7/2006 | Schworm | 455/575.1 |
| 2008/0015000 | A1 * | 1/2008 | Jung | 455/575.1 |
| 2008/0081679 | A1 * | 4/2008 | Kawasaki et al. | 455/575.8 |
| 2009/0168337 | A1 * | 7/2009 | Conti et al. | 361/679.56 |
| 2009/0253472 | A1 * | 10/2009 | Kim | 455/575.1 |

FOREIGN PATENT DOCUMENTS
DE 4407967 10/1995

OTHER PUBLICATIONS

Schworm, Ernst; Patent Application Publication No. US 2006/0166711 A1; Publication Date: Jul. 27, 2006; "Enclosure, Particularly a Housing for a Mobile Telephone and Method . . . ;"

* cited by examiner

*Primary Examiner* — Anthony Q Edwards
(74) *Attorney, Agent, or Firm* — Cha & Reiter, LLC

(57) ABSTRACT

Disclosed is a portable electronic device having an interceptor for cutting off foreign substances such as water, dust or the like from being entered between the coupling surfaces thereof. The portable electronic device includes: a first case; a second case to be joined with the first case; and an intercepting part integrally formed with at least one of the first case or the second case, wherein the intercepting part is sealingly engaged with the coupling surface of the first case or the second case to prevent foreign substances and waterproof the device thereof.

9 Claims, 5 Drawing Sheets

PORTABLE ELECTRONIC DEVICE HAVING INTERCEPTOR FOR FOREIGN SUBSTANCE

CLAIM OF PRIORITY

This application claims the priority of an earlier application entitled "Portable Electronic Device Having Interceptor For Foreign Substance", filed in the Korean Intellectual Property Office on Feb. 4, 2009 and assigned Serial No. 10-2009-0008747, the contents of which are hereby incorporated by reference.

BACKGROUND OF THE INVENTION

1. Field of the Invention

The present invention relates to a portable electronic device, and more particularly to a portable electronic device having an interceptor capable of preventing foreign substances such as dust, water or the like from entering.

2. Description of the Related Art

In general, a portable electronic device refers to a device such as a portable terminal, an mp3 player, a portable multimedia player (PMP) or the like, which enables a user to access a variety of contents. Such devices have been developed and miniaturized to have multi-functions to meet various consumers' demands. Specifically, in the case of the portable terminal it has provided the user with not only a data transmitting and receiving service but also a variety of multimedia services such as providing letter information, image information, an mp3, the Internet, a digital multimedia broadcasting (DMB), games or the like.

Further, the usage of portable terminal has been widely spread due to the various functions as described above. The terminal is carried by a user to many places, including a hot dry or wet sauna, a swimming pool or a water park in summer, or a ski resort or the like in winter.

Since the portable terminal has been used in a variety of places as stated above, there is a great chance that foreign substances such as dust, moisture or water can be introduced into the inside of the portable terminal, causing damages.

As shown in FIGS. 1 and 2, a portable terminal 10 in the prior art includes an upper case 11 and a lower case 12 to be joined with the former. A rubber member 13 is provided to prevent water from penetrating into a coupling surface formed between the upper case 11 and the lower case 12. The rubber member 13 is inserted into the coupling surface between the upper case 11 and the lower case 12. Formed on the coupling surface of the lower case 12 is a U-shaped groove 14 for receiving the rubber member 13. After joining the upper case 11 and the lower case 12 together, the rubber member 13 is inserted into and rests within the groove 14, which intercepts the foreign substances or water being entered and prevents them from entering the inside of the portable terminal 10.

However, the prior art having configurations as described above has a drawback in that it the rubber member made from a soft material, which is inserted into the U-shaped groove formed in the coupling surface between the upper case and the lower case, tend to deteriorate over time. However, if a hard rubber member is employed to improve the assembling characteristics instead of the soft rubber member, the sealing force of the rubber member is reduced, which lowers waterproofness of the device and further creates an undesirable gap between the upper case and the lower case.

Furthermore, since the rubber member is formed in a shape to be closely fitted in the groove, it is difficult to design such fine dimension, size, pattern or the like when forming with the rubber member.

SUMMARY OF THE INVENTION

Accordingly, the present invention has been made to solve the above-mentioned problems occurring in the prior art and provides additional advantages, by providing g a portable electronic device having an interceptor, wherein the interceptor is integrally formed with at least one case of the portable electronic device to improve assembling characteristics, and wherein the interceptor prevents a gap from being created between the cases, thus preventing foreign substances or water from being entered.

In accordance with the present invention, a portable electronic device having an interceptor for foreign substances includes: a first case; a second case to be joined with the first case; and an intercepting part integrally formed with at least one of the first case or the second case, wherein the intercepting part is sealingly engaged with a coupling surface between the first case and the second case to prevent foreign substances from being entered and waterproof the device thereof.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Hereinafter, exemplary embodiments of the present invention will be described with reference to the accompanying drawings. In the following description, various specific definitions found in the following description are provided only to help general understanding of the present invention, and it is apparent to those skilled in the art that the present invention can be implemented without such definitions.

Figure 1:
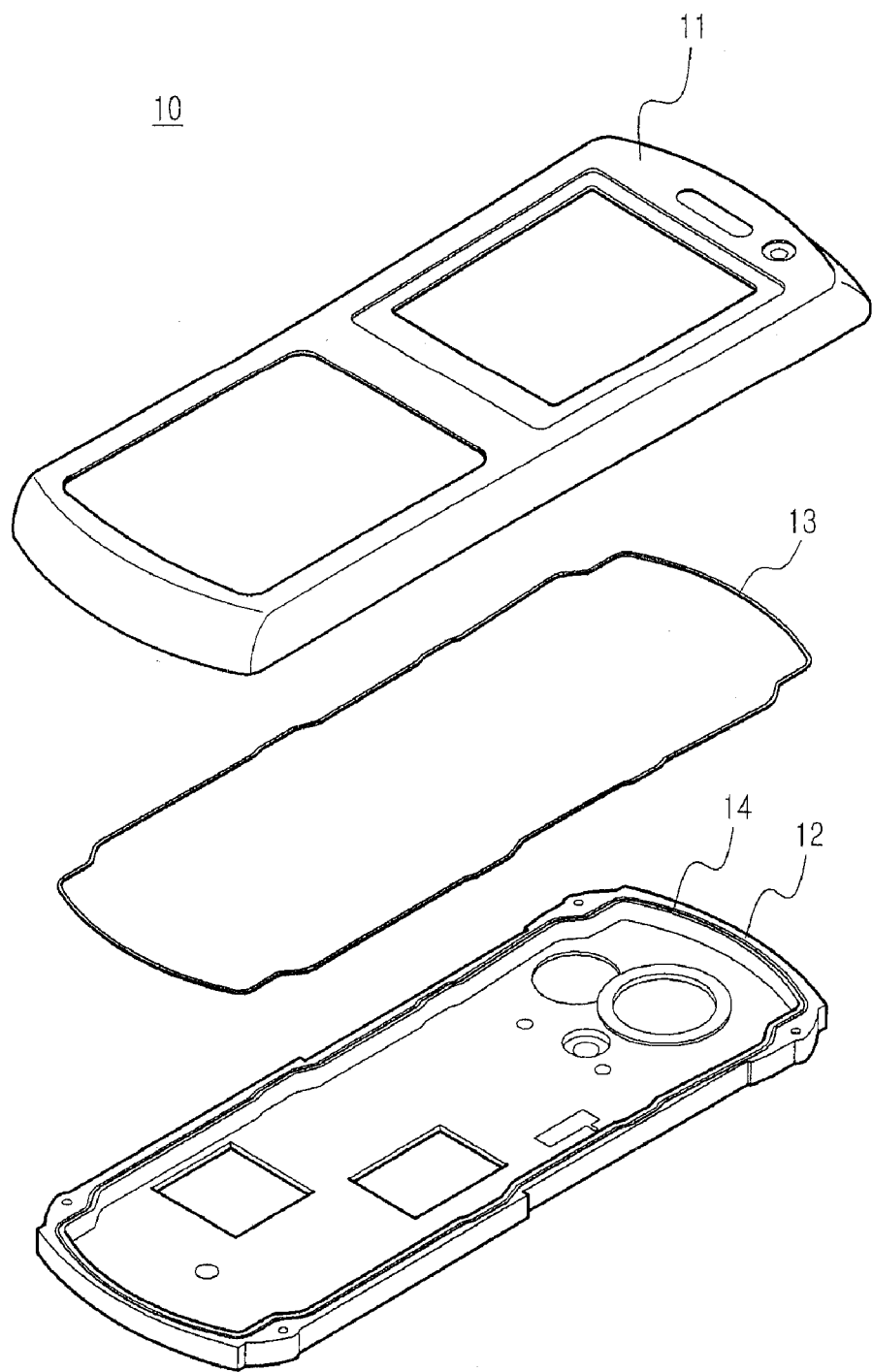
FIG. 1 is an exploded perspective view illustrating a portable electronic device having an interceptor for preventing foreign substances from being entered in accordance with the prior art.
Figure 2:
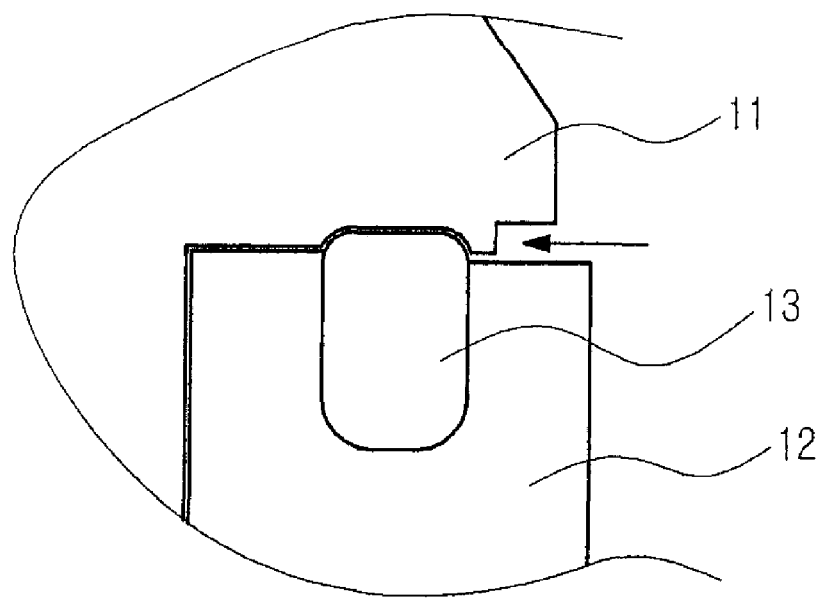
FIG. 2 is an enlarged partially cut away sectional view illustrating the portable electronic device having an interceptor for preventing foreign substances from being entered in accordance with the prior art.
Figure 3:
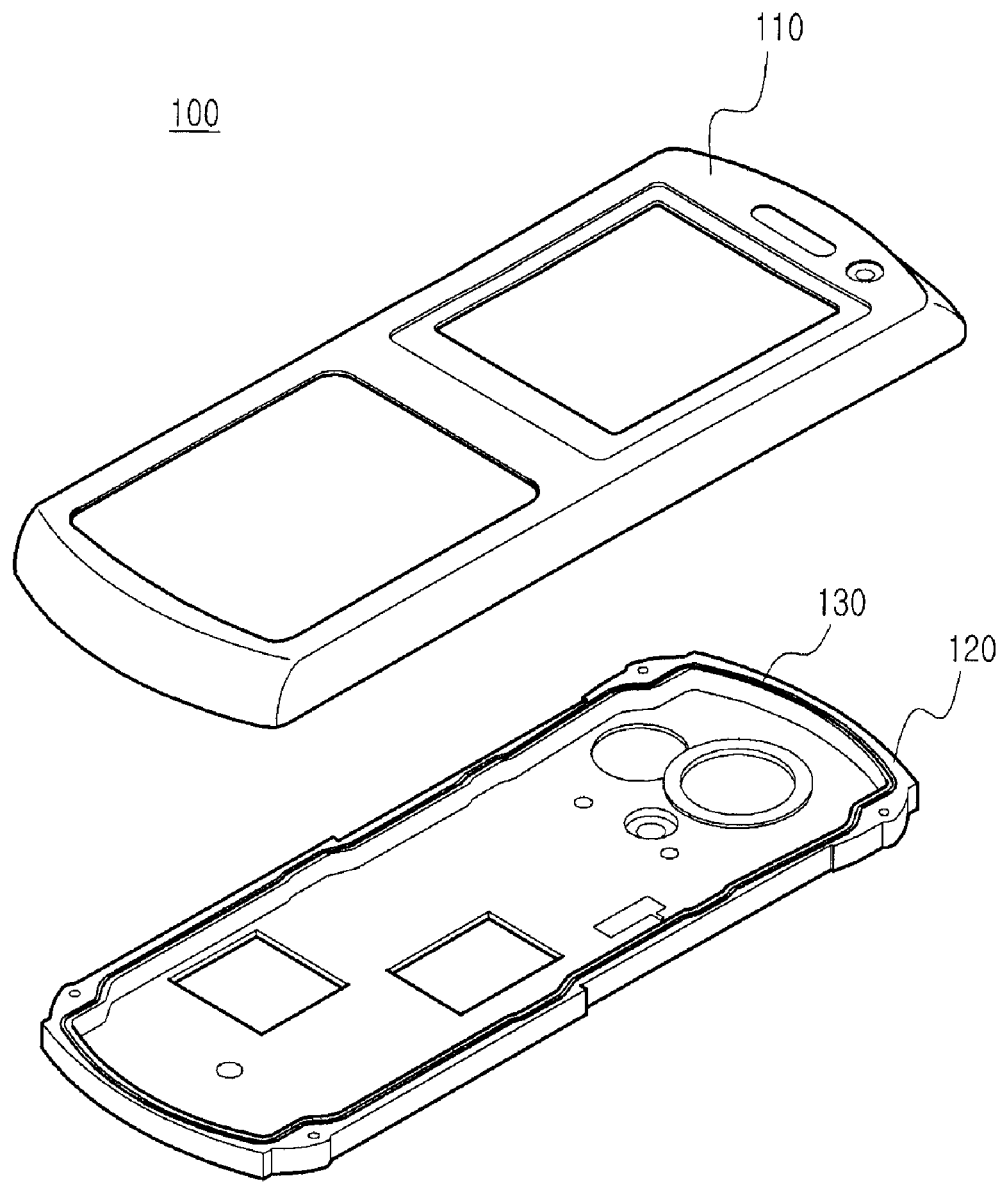
FIG. 3 is an exploded perspective view illustrating the portable electronic device having an interceptor for preventing foreign substances from being entered in accordance with a preferred embodiment of the present invention.

Referring to FIG. 3, a portable electronic device 100 having an interceptor for preventing foreign substances includes a first case 110, a second case 120 to be joined with the first case 110, and an intercepting part 130 for cutting off the foreign substances from being entered. The interceptor for cutting off foreign substances, i.e., intercepting part 130 is integrally formed with at least one of the first case 110 or the second case 120, such that it is sealingly engaged with the first case 110 or the second case 120 to prevent the foreign substances from entering therebetween and waterproof the device thereof. FIG. 3 shows an embodiment that the intercepting part 130 is integrally formed with the second case 120 for illustrative purpose.

Figure 4:
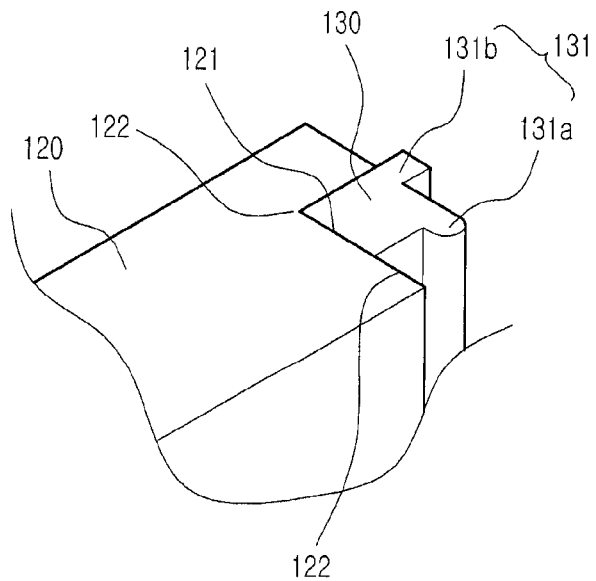
FIG. 4 is an enlarged partially cut away perspective view illustrating the portable electronic device having an interceptor for preventing foreign substances from being entered in accordance with a preferred embodiment of the present invention, wherein an intercepting part is integrally formed with at least one of a first case or a second case.
Figure 5:
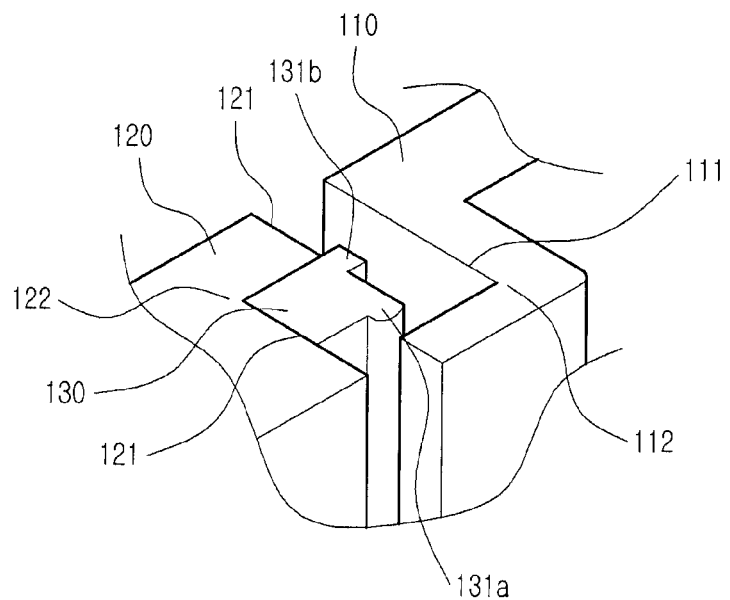
FIG. 5 is an enlarged partially cut away perspective view illustrating the portable electronic device having an interceptor for preventing foreign substances from being entered in accordance with a preferred embodiment of the present invention, wherein the first case is not yet joined with the second case.
Figure 6:
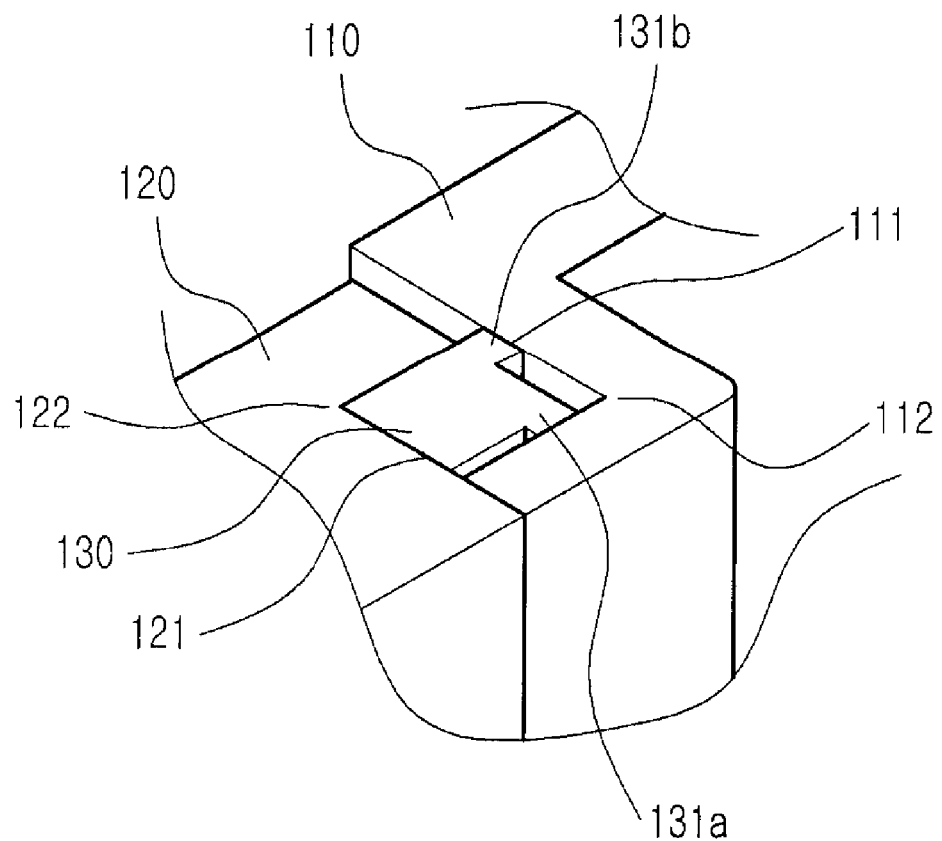
FIG. 6 is an enlarged partially cut away perspective view illustrating the portable electronic device having an interceptor for preventing foreign substances from being entered in accordance with a preferred embodiment of the present invention, wherein the first case is joined with the second case.

Referring now to FIGS. 4 through 6, the intercepting part 130 is provided with at least one or more protrusions 131, (131a or 131b), which are in sealingly close contact with a coupling surface 111 of the first case 110 or a coupling surface 121 of the second case 120. The coupling surface 121 is formed of a second stepped portion 122 which is projecting outward from the second case 120. The intercepting part 130 is integrally formed with the second stepped portion 122.

As shown in FIGS. 5 and 6, the coupling surface 111 is formed of a first stepped portion 112 which is extending inward to the first case 110. The protrusion 131 makes sealingly close contact with the first stepped portion 112. The protrusion 131 includes a first protrusion 131a and a second protrusion 131b. The first protrusion 131a is designed to be brought into a close contact with one side surface of the first stepped portion 112 to shield the foreign substances or water from being introduced therebetween. Likewise, the second protrusion 131b is adapted to make a close contact with the other side surface of the first stepped portion 112 to further prevent the foreign substances or water from being entered therebetween.

The intercepting part 130 is formed of a soft rubber member, and is formed with one of the coupling surfaces of the first case 110 or the second case 120 using a double injection molding. FIGS. 4 through 6 illustrate that the intercepting part 130 is provided at the second case 120 by means of the double injection molding.

In addition, the first case 110 and the second case 120 are made from a plastic material such as polyethylene terephthalate (PET), polyester or the like.

As shown in FIG. 4, the intercepting part 130 is sealingly provided at and extended along the second stepped portion 122. Since the intercepting part 130 is integrally formed with the second case 120, a gap formed between the intercepting part 130 and the second case 120 is sealingly closed to each other, thereby preventing the foreign substances or water from entering such gap.

Referring again to FIGS. 4 through 6, as described hereinabove, the intercepting part 130 is formed with at least one or more protrusions 131 which are in sealingly close contact with the coupling surface 111 of the first case 110. In other words, the protrusion 131 includes the first protrusion 131a and the second protrusion 131b, which faces in a direction perpendicular to the first protrusion 131a. When the first case 110 is joined together with the second case 120, the intercepting part 130 is engaged with the first stepped portion 112 formed at the coupling surface 111. Since the protrusion 131 is formed with a soft rubber member and having elasticity, it is sealingly engaged with the coupling surface 111 of the first stepped portion 112 by joining the first case 110 with the second case 120.

Hence, the first protrusion 131a is sealingly engaged with one coupling surface of the first stepped portion 112 to cut off or prevent the foreign substances or water from being introduced through the gap between the first case 110 and the second case 120. In addition, the second protrusion 131b is then sealingly engaged with the other coupling surface perpendicular to other side of the first stepped portion 112 of the intercepting part 130, thereby further intercepting the foreign substances or water entering through the first protrusion 131a.

With integrally forming the intercepting part 130 with one of the first case 110 or the second case 120 using double injection molding, it is possible to easily assemble the device and also prevent the creation of dimensional tolerance between the first case 110 and the second case 120 when being assembled.

Moreover, it can be appreciated that the intercepting operation for the foreign substances can be further improved by providing at least one or more protrusions 131 at the intercepting part 130, wherein the protrusions 131 are sealingly engaged with the coupling surface of the first case 110 or the second case 120 when these cases 110 and 120 are joined together. Particularly, it can be easily seen that the present invention may perform a double intercepting operation for the foreign substances or water from being entered with two intercepting parts 130.

Moreover, the present invention can make the manufacturing process of the device easier by forming the intercepting part 130 with at least one of the first case 110 or the second case 120 using injection molding, and further by enabling the intercepting part 130 to be sealingly engaged with the other case.

With the present portable electronic device having an interceptor for foreign substances as described above, it has an advantageous effect in that it is possible to simplify the assembling characteristics of the device and further prevent the creation of the gap or deformation between the coupling surfaces when the device is assembled, by integrally forming the intercepting part with at least one coupling surface of the first case or the second case using the double injection molding.

In addition, the present invention has another advantageous effect in that it can improve the waterproofness of the device by sealingly closing the coupling surface between the first case and the second case, since it is possible to precisely manage the dimensional tolerance of the intercepting part by integrally forming the intercepting part with at least one of the first case or the second case through injection molding.

Furthermore, it can be noted that the present invention has still another advantageous effect in that it can provide a double intercepting structure capable of positively cutting off the penetration of the foreign substances or water with formation of two protrusions at the intercepting part.

The embodiments of the portable electronic device set forth hereinabove have been presented for illustrative purposes only and, therefore, the present invention is not limited to these embodiments and drawings. It will be understood by those skilled in the art that various changes and modifications may be made without departing from the scope of the invention defined in the claims.

What is claimed is:

1. A portable electronic housing for preventing foreign substances from entering thereto, comprising:
   a first case;

a second case attachably coupled to the first case; and an intercepting part arranged along a perimeter of the housing and integrally formed with at least one of the first case or the second case, wherein the intercepting part is sealingly engaged with the first case or the second case and is enclosed within a channel defined by interlocking edges of the first case and the second case that are in contact with each other and surround the intercepting part to form an interlocking boundary having the intercepting part in the channel there between to prevent the foreign substances from entering the housing and for waterproofing the housing.

2. The portable electronic housing as recited in claim 1, wherein the intercepting part includes at least one protrusion to be sealingly engaged with a coupling surface of the first case or a coupling surface of the second case.

3. The portable electronic housing as recited in claim 2, wherein the coupling surface of the second case is formed with a second stepped portion projecting outward from the second case, and wherein the intercepting part is integrally formed with the second stepped portion.

4. The portable electronic housing as recited in claim 2, wherein the coupling surface of the first case is formed with a first stepped portion extending inward to the first case, and wherein the protrusion is sealingly engaged with the first stepped portion.

5. The portable electronic housing as recited in claim 4, wherein the protrusion includes a first protrusion sealingly engaged with the coupling surface of the first stepped portion to prevent the foreign substances or water from being entered; and a second protrusion facing perpendicularly to the first protrusion and sealingly engaged with the other coupling surface of the first stepped portion to further prevent the foreign substances or water from being entered.

6. The portable electronic housing as recited in claim 1, wherein the intercepting part is formed with a soft rubber material.

7. The portable electronic housing as recited in claim 5, wherein the intercepting part is formed with one of the coupling surface of the first case or the second case via a double injection molding.

8. The portable electronic housing as recited in claim 1, wherein the intercepting part has at least two protruding edges that extend in substantially perpendicular directions to each other within the channel.

9. The portable electronic housing as recited in claim 8, wherein the at least two protruding edges of the intercepting part form respective seals from being elastically in contact with respective interior surfaces of the interlocking edges defining the channel.

* * * * *